(12) United States Patent
Drewery et al.

(10) Patent No.: US 9,490,106 B2
(45) Date of Patent: Nov. 8, 2016

(54) INTERNAL FARADAY SHIELD HAVING DISTRIBUTED CHEVRON PATTERNS AND CORRELATED POSITIONING RELATIVE TO EXTERNAL INNER AND OUTER TCP COIL

(75) Inventors: John Drewery, Santa Clara, CA (US); Maolin Long, Cupertino, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 958 days.

(21) Appl. No.: 13/198,683

(22) Filed: Aug. 4, 2011

(65) Prior Publication Data
US 2012/0273130 A1    Nov. 1, 2012

Related U.S. Application Data

(60) Provisional application No. 61/480,314, filed on Apr. 28, 2011.

(51) Int. Cl.
*H01J 37/32* (2006.01)

(52) U.S. Cl.
CPC ........ *H01J 37/32651* (2013.01); *H01J 37/321* (2013.01); *H01J 37/32633* (2013.01)

(58) Field of Classification Search
CPC .................... H01J 37/32651; H01J 37/32623; H01J 37/32633; H01J 37/321; H05H 2001/4652
See application file for complete search history.

(56) References Cited

U.S. PATENT DOCUMENTS

| | | |
|---|---|---|
| 4,633,812 A | 1/1987 | Fujiyama |
| 4,918,031 A | 4/1990 | Flamm et al. |

(Continued)

FOREIGN PATENT DOCUMENTS

| | | | |
|---|---|---|---|
| EP | 0 801 413 A1 | 10/1997 | |
| EP | 2 039 729 A2 | 3/2009 | ............... C09C 1/00 |

(Continued)

OTHER PUBLICATIONS

PCT International Search Report and Written Opinion of the International Searching Authority (ISA) issued in International Application No. PCT/US2012/034837, ISA/US Commissioner for Patents, Apr. 24, 2012.

(Continued)

*Primary Examiner* — Jeffrie R Lund
*Assistant Examiner* — Yuechuan Yu
(74) *Attorney, Agent, or Firm* — Martine Penilla Group, LLP

(57) ABSTRACT

Plasma processing chambers having internal Faraday shields with defined groove configurations, are defined. In one example, the chamber includes an electrostatic chuck for receiving a substrate and a dielectric window connected to a top portion of the chamber, where the dielectric window disposed over the electrostatic chuck. Also included is a Faraday shield disposed inside of the chamber and defined between the electrostatic chuck and the dielectric window. The Faraday shield includes an inner zone having an inner radius range, a middle zone having a middle radius range, an outer zone having an outer radius range, where the inner zone is adjacent to the middle zone, and the middle zone being adjacent to the outer zone. Further defining the Faraday shield is a first set of radial slots (A) extending through the inner zone, the middle zone, and the outer zone, a second set of radial slots (C) extending through only the outer zone; and a third set of radial slots (B) extending through the middle zone and outer zone. In this configuration, the first, second and third radial slots are arranged radially around the Faraday shield in a repeating pattern of slots A, C, B, and C.

9 Claims, 15 Drawing Sheets

(56) References Cited

U.S. PATENT DOCUMENTS

| | | | |
|---|---|---|---|
| 5,525,159 A | 6/1996 | Hama et al. | |
| 5,540,800 A | 7/1996 | Qian | |
| 5,622,635 A | 4/1997 | Cuomo et al. | |
| 6,197,165 B1 * | 3/2001 | Drewery et al. | 204/192.12 |
| 6,250,563 B1 | 6/2001 | Frank et al. | |
| 6,280,563 B1 | 8/2001 | Baldwin, Jr. et al. | |
| 6,367,412 B1 | 4/2002 | Ramaswamy et al. | |
| 6,422,173 B1 | 7/2002 | Nakajima | |
| 6,474,258 B2 | 11/2002 | Brcka | 118/723 I |
| 6,503,364 B1 | 1/2003 | Masuda et al. | |
| 6,523,493 B1 | 2/2003 | Brcka | 118/723 I |
| 6,531,030 B1 | 3/2003 | Nakajima | |
| 6,666,982 B2 | 12/2003 | Brcka | |
| 6,946,054 B2 * | 9/2005 | Brcka | 156/345.48 |
| 7,223,321 B1 | 5/2007 | Comendant et al. | |
| 7,413,673 B2 | 8/2008 | Lohokare et al. | |
| 2001/0022158 A1 | 9/2001 | Brcka | 118/723 I |
| 2003/0015293 A1 * | 1/2003 | Obuchi | 156/345.48 |
| 2003/0075349 A1 | 4/2003 | Kruse et al. | |
| 2004/0083971 A1 * | 5/2004 | Holland et al. | 118/721 |
| 2004/0163595 A1 | 8/2004 | Edamura et al. | 118/723 I |
| 2004/0194890 A1 | 10/2004 | Moroz | |
| 2005/0103444 A1 | 5/2005 | Brcka | |
| 2005/0103445 A1 | 5/2005 | Brcka | |
| 2006/0130758 A1 | 6/2006 | Lohokare et al. | 118/715 |
| 2006/0169669 A1 | 8/2006 | Zojaji et al. | 216/58 |
| 2007/0113981 A1 | 5/2007 | Brcka | |
| 2007/0181257 A1 | 8/2007 | Comendant et al. | 156/345.48 |
| 2007/0238199 A1 | 10/2007 | Yamashita | 438/5 |
| 2008/0135518 A1 | 6/2008 | Chen et al. | 216/67 |
| 2010/0096088 A1 * | 4/2010 | Okita et al. | 156/345.48 |
| 2011/0204023 A1 | 8/2011 | Huh et al. | 216/37 |
| 2011/0297320 A1 | 12/2011 | Sakka et al. | 156/345.48 |

FOREIGN PATENT DOCUMENTS

| | | | | |
|---|---|---|---|---|
| JP | 08227800 A | * | 9/1996 | |
| TW | 340295 | | 9/1998 | H05H 1/00 |
| TW | 200635446 A | | 10/2006 | H05H 1/24 |
| TW | 200921719 A | | 5/2009 | H01F 10/193 |

OTHER PUBLICATIONS

U.S. Appl. No. 10/345,582, filed Jan. 15, 2003, Comendant et al.
U.S. Appl. No. 13/198,683, filed Aug. 4, 2011, Drewery et al.
U.S. Appl. No. 13/896,175, filed May 16, 2013, Sant et al.
U.S. Appl. No. 13/974,324, filed Aug. 23, 2013, Sriraman et al.
Mahoney et al., Electron-density and energy distributions in a planar inductively.
Taiwan Search Report, 102138117, p. 5 from Examination Opinions, Nov. 10, 2014.
Singapore Search Report, 201307543-7, pp. 1-8, May 13, 2014.

* cited by examiner

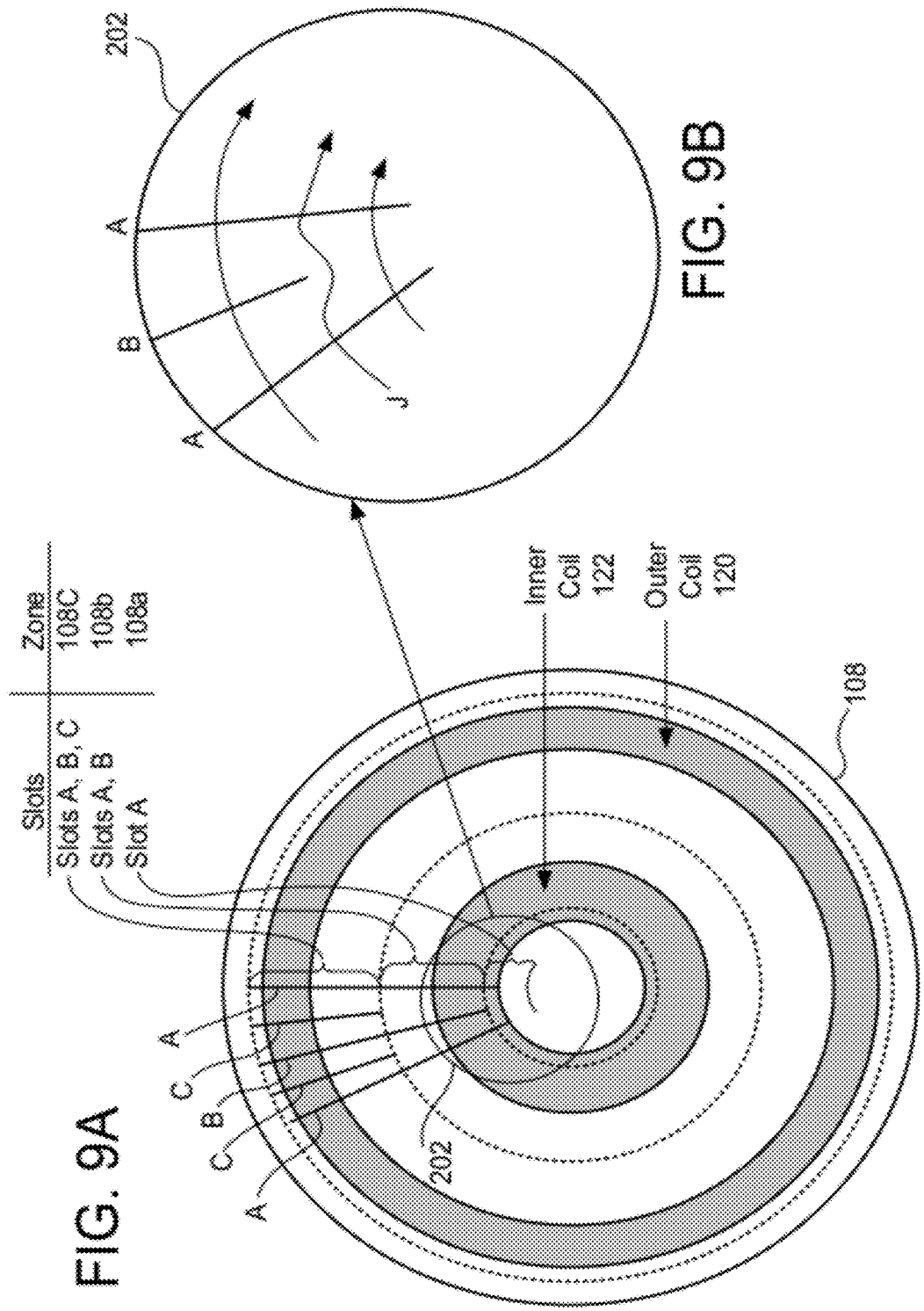

TOP ISOMETRIC VIEW

BOTTOM ISOMETRIC VIEW

FACING WINDOW

FACING CHUCK

INTERNAL FARADAY SHIELD HAVING DISTRIBUTED CHEVRON PATTERNS AND CORRELATED POSITIONING RELATIVE TO EXTERNAL INNER AND OUTER TCP COIL

PRIORITY CLAIM

This application claims priority from U.S. Provisional Patent Application No. 61/480,314 filed on Apr. 28, 2011 and entitled "Internal Faraday Shield Having Distributed Chevron Patterns and Correlated Positioning Relative to External Inner and outer TCP Coil," which is incorporated herein by reference in its entirety for all purposes.

1. FIELD OF THE INVENTION

The present invention relates generally to semiconductor fabrication, and more particularly, to an apparatus containing a Faraday shield for maintaining the condition of a window of an inductively coupled plasma etching apparatus.

2. DESCRIPTION OF THE RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

The reaction products generated by the etching process may be volatile or non-volatile. The volatile reaction products are discarded along with used reactant gas through the gas exhaust port. The non-volatile reaction products, however, typically remain in the etching chamber. The non-volatile reaction products may adhere to the chamber walls and a dielectric window. Adherence of non-volatile reaction products to the window may interfere with the etching process. Excessive deposition may result in particles flaking off the window onto the wafer, thus interfering with the etching process. Excessive deposition, therefore, requires more frequent cleaning of the chamber walls and the window which adversely affects wafer throughput. Additionally, if the window becomes coated with etch byproducts, the ability of the chamber transmit sufficient magnetic flux to the plasma becomes diminished, which in turn reduces the ability to control the directionality of etch operations, which are critical when processing high aspect ratio profile features.

In view of the foregoing, there is a need for an apparatus and methods for protecting a process chamber's dielectric window, while maintaining the ability to transmit sufficient levels of magnetic flux to the plasma.

SUMMARY

Disclosed is an apparatus used in etching semiconductor substrates and layers formed thereon during the manufacturer of semiconductor devices. The apparatus is defined by a chamber in which etching is performed. The apparatus includes a chuck for supporting a substrate to be etched, connections to RF power and ground, a dielectric window located in an upper roof section of the chamber and a radio frequency (RF) coil disposed over the dielectric window. Further disposed within the chamber is a Faraday shield.

Plasma processing chambers having internal Faraday shields with defined groove configurations are provided. In one example, the chamber includes an electrostatic chuck for receiving a substrate and a dielectric window connected to a top portion of the chamber, where the dielectric window is disposed over the electrostatic chuck. Also included is a Faraday shield disposed inside of the chamber, and defined between the electrostatic chuck and the dielectric window. The Faraday shield includes an inner zone having an inner radius range, a middle zone having a middle radius range, an outer zone having an outer radius range, where the inner zone is adjacent to the middle zone, and the middle zone being adjacent to the outer zone. Further defining the Faraday shield is a first set of radial slots (A) extending through the inner zone, the middle zone, and the outer zone, a second set of radial slots (C) extending through only the outer zone; and a third set of radial slots (B) extending through the middle zone and outer zone. In this configuration, the first, second and third radial slots are arranged radially around the Faraday shield in a repeating pattern of slots A, C, B, and C.

In another embodiment, a Faraday shield for installation inside of a chamber is provided. The Faraday shield is defined from a circular plate structure having a center hole. The circular plate structure includes an inner zone having an inner radius range, a middle zone having a middle radius range, an outer zone having an outer radius range, where the inner zone is adjacent to the middle zone, and the middle zone is adjacent to the outer zone. Further defining the Faraday shield is a first set of radial slots (A) extending through the inner zone, the middle zone, and the outer zone, a second set of radial slots (C) extending through only the outer zone, and a third set of radial slots (B) extending through the middle zone and outer zone, wherein the first, second and third radial slots are arranged radially around the Faraday shield in a repeating pattern of slots A, C, B, and C. And, each one of the slots A, B, and C are defined from a chevron groove.

In one embodiment, the Faraday shield is disposed proximate to the dielectric window to prevent or substantially reduce deposits on the surface of the dielectric window. In this embodiment, the Faraday shield is defined with a plurality of radial slots, each configured from a chevron pattern. The radial slots are distributed around the Faraday shield, such that in one embodiment, three slot zones are defined. The three slot zones are defined in the radial configuration, wherein one slot (A) extends across all three zones (inner, middle, outer), followed by one slot (C) that extends only along the outer zone, and followed by one slot (B) that extends across the outer and middle zones. This pattern will then repeat radially around the Faraday shield, defining a pattern of A,C,B, C, A,C,B, C, A,C,B,C, A,C,B, . . . etc.

The chevron slots are configured so that no direct line of sight, or free path is provided for etch materials to penetrate through the Faraday shield and reach the dielectric window. It should be understood that the chevron slot geometry is only one example, and other geometric slot configurations are possible to reduce or prevent a free line of sight from the bulk plasma area to the dielectric window. The chevron design is advantageous in the radial geometry because of its interlocking nature. In principle, the metal walls of the chevron can get very thin, and they are limited only by mechanical strength and thermal considerations. Other prior designs do not interlock but have a minimum spacing, which makes them less useful in a radial layout.

In one embodiment, the Faraday shield is optimized to operate with the geometric configuration of the RF coil. For instance, the RF coil that is placed exterior to the chamber and over the dielectric window, is correlated to the distribution of the slots A, B, and C, and also correlated to the three zones that are defined along the radial direction. In this embodiment, to get a reasonable passage of flux through the shield, some slots will be under the coil.

In still another embodiment, the Faraday shield, being placed in the correlated relationship to the zones of the Faraday shield, is also coupled to tuning circuitry.

Without a Faraday shield optimized as defined herein, deposits that result from the etching materials and etch chemistries would more readily adhere to the inner surface of the dielectric window, which eventually impacts the capability of the RF coils to impart sufficient energy and control to a plasma that is generated within the chamber. Such impacts can include reductions in ion energy in the plasma, reductions in radial control of ion density, and other process reducing drawbacks. For example, etching of refractory metals leads to so much deposits on the dielectric window of the chamber, and these electrically conductive deposits (as they build up) increasingly prevent the coupling of magnetic fields from the excitation coil to the plasma. This leads to a reduction in plasma density, process drift, and eventually an inability to ignite an inductive plasma. Furthermore, although some reductions in process performance would be acceptable in past chamber configurations, the drive to shrink feature sizes has continued to demand even tighter tolerances in process performance. Commensurate with feature size shrinking is the resulting demands to etch very high aspect ratio features.

Thus, feature sizes continue to decrease to the low nanometer process nodes and beyond, it is no longer acceptable to experience drifts in etch equipment performance over time. Further impacting this issue, is the complementary fabrication demands for high throughput, and less time to perform equipment clean operations.

BRIEF DESCRIPTION OF THE DRAWINGS

The invention, together with further advantages thereof, may best be understood by reference to the following description taken in conjunction with the accompanying drawings.

FIG. 9A illustrates the path of image current under the inner coil, in accordance with one embodiment of the present invention.

FIG. 9B illustrates an example of a portion of current going around rather than through slot B, in accordance with one embodiment of the present invention.

DETAILD DESCRIPTION

Figure 1A:
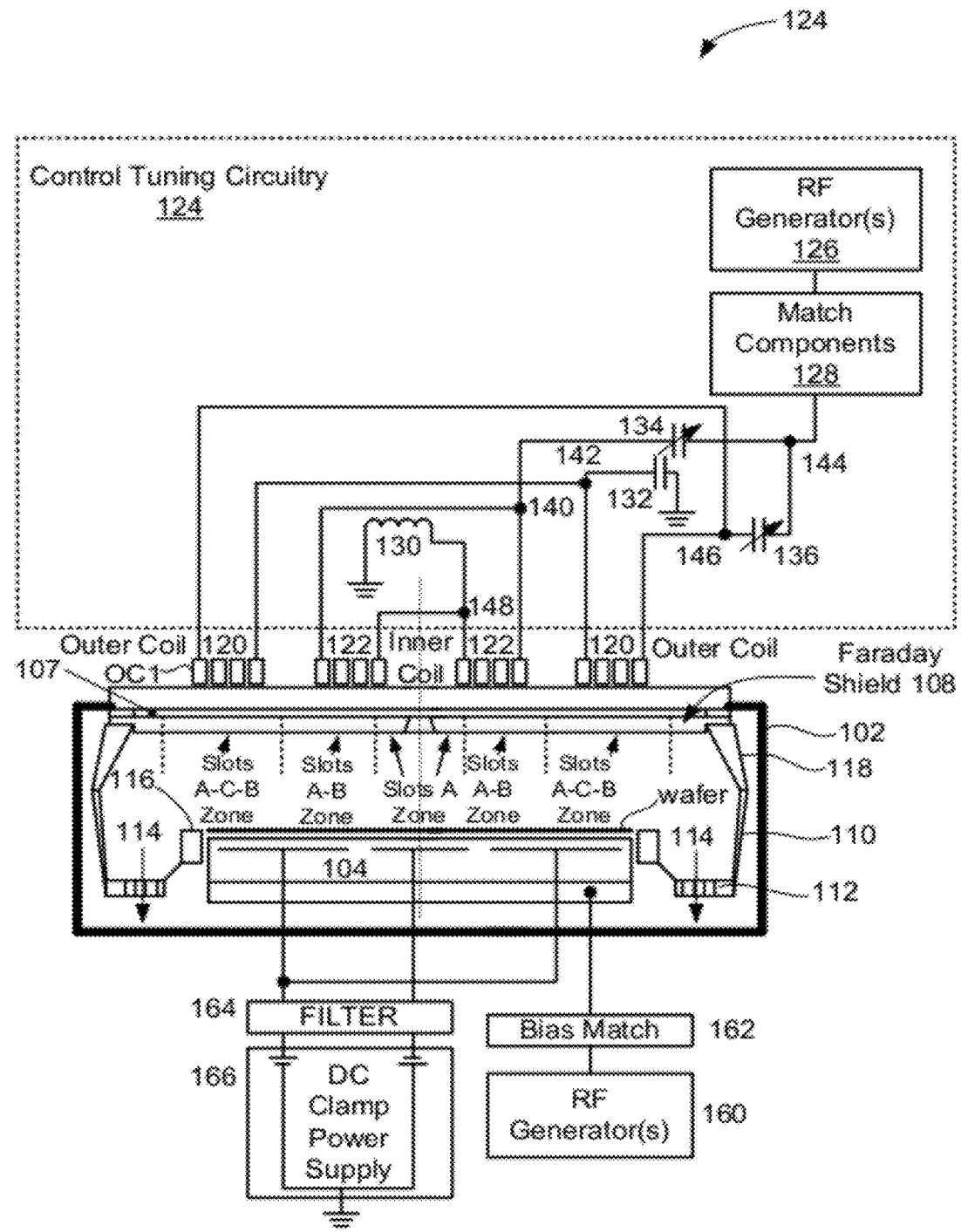
FIG. 1A illustrates a plasma processing system utilized for etching operations, in accordance with one embodiment of the present invention.

Disclosed is an apparatus used in etching semiconductor substrates and layers formed thereon during the manufacture of semiconductor devices. The apparatus is defined by a chamber in which etching is performed. A Faraday shield is disposed within the chamber, and is configured with a three zone slot configuration that is correlated to the placement of a TCP coil disposed over a dielectric window of the chamber. In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

In an inductively coupled plasma etch module comprising a planar window and a generally planar excitation coil, adapted for etching metals that resist dry etching, a slotted shield is disposed inside the process module, between the insulating vacuum barrier window and the process space. This shield comprises a metal, preferably copper or aluminum. The shield preferably contains multiple radial slots that penetrate the thickness of the shield. Preferably, the slots provide that there is no line of sight through the shield, and are optimized to capture non-volatile material that originates from the process space by such material adhering to the inner walls of the slots. Furthermore the number and physical dimensions of the slots are optimized to provide maximum penetration of alternating magnetic fields generated by the excitation coils through the shield, simultaneously with good thermal uniformity of the shield, the ability to control the temperature rise in the shield, and mechanical rigidity. The shield is preferably coated on all facets facing the process space with a rough coating or applied texture, to improve adhesion of deposited material.

The shield may be galvanically connected to earth, isolated, or powered using a suitable AC or DC power source. If isolated or powered, the shield may comprise a conducting, slotted portion mounted in an insulating structure that prevents unintended electrical shorting of the conducting portion to other components of the system. Such a shield may comprise multiple separate parts or may be bonded into a single unit. In one embodiment, the Faraday shield installed within the chamber as defined herein is optimized for highly demanding etch applications. Without limitation, such etch applications include etching device features in the making of magneto-resistive random access memory (MRAM) devices. In this configuration, the Faraday shield is grounded and is well configured to block capacitive coupling during operation.

Also, since the capacitive coupling has been reduced to the plasma, this has the added advantage that the Plasma potential is reduced and subsequently the electron temperature of the plasma is reduced. This "Cooling" of the plasma may be beneficial for plasma processing, as it will benefit soft etch applications where Si recess is presently at issue.

The design of the Faraday shield internal to the chamber can be used in an inductively coupled plasma reactor to etch materials like, Pt, Ir, PtMn, PdCo, Co, CoFeB, CoFe, NiFe, W, Ag, Cu, Mo, TaSn, Ge2Sb2Te2, InSbTe Ag—Ge—S, Cu—Te—S, IrMn, Ru. The concept can be extended to materials like NiOx, SrTiOx, Perovskite (CaTiO3), PrCAMnO3, PZT (PbZr1-xTixO3), (SrBiTa) O3 to keep the dielectric window clean of any deposition. The process can be combined with a suitable dry plasma clean process to keep the surface of the shield clean and control plasma drift. The internal Faraday shield could be used with any gas combination that is available in a present day fab (including CO, NH3, CH3OH+std. gases). Again, the internal Faraday shield can be grounded, floating or powered as required in order to meet process needs.

FIG. 1A illustrates a plasma processing system utilized for etching operations, in accordance with one embodiment of the present invention. The system includes a chamber 102 that includes a chuck 104, a dielectric window 106, and a Faraday shield 108. The chuck 104 can be an electrostatic chuck for supporting the substrate when present. Also shown is an edge ring 116 that surrounds chuck 104, and has an upper surface that is approximately planar with a top surface of a wafer, when present over chuck 104. Chamber 102 also includes a lower liner 110 that is coupled to an upper liner 118. The upper liner 118 is configured to support the Faraday shield 108. In one embodiment, the upper liner 118 is coupled to ground and therefore provides ground to the Faraday shield 108. A space 107 is provided between the Faraday shield 108 and the dielectric window 106. As shown, the Faraday shield 108 is divided in to a plurality of zones.

Further shown is an RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 104. The chuck 104 also includes electrostatic electrodes to enable the chucking and dechucking of the wafer. Broadly, a filter 164 and a DC clamp power supply is provided. Other control systems for lifting the wafer off of the chuck 104 can also be provided. Although not shown, pumps are connected to the chamber 102 to enable vacuum control and removal of gaseous byproducts from the chamber during operational plasma processing. As noted above, the Faraday shield in one embodiment is grounded by way of its connection to the grounded chamber wall.

The zones, in one embodiment, are divided into three sections. The inner zone will include slots A, the middle zone will include slots A-B, and the outer zone will include slots A-B-C, as will be explained in more detail below. The Faraday shield 108 preferably includes a plurality of radial slots that are defined by grooves machined into a Chevron pattern. As noted above, the chevron pattern is configured to prevent a direct line of sight to the processing material in the chamber during plasma processing, such as etching. By providing the chevron pattern, the Faraday shield 108 is configured to protect the surface of the dielectric window 106, during operation. The dielectric window 106 is preferably separated from the Faraday shield 108 by a space 107, as noted above. The Faraday shield 108 is disposed above the chuck 104, which also operates as a bottom electrode.

The Faraday shield has a central region that will allow a showerhead to deliver process gases into the processing volume of the chamber 102. Additionally, other probing apparatus can also be disposed through the Faraday shield 108 near the central region, where the whole is provided. The probing apparatus can be provided to probe process parameters associated with the plasma processing system, during operation. Probing processes can include endpoint detection, plasma density measurements, ion density measurements, and other metric probing operations. As shown, the Faraday shield has a central zone that includes slots A, a middle region that includes slots A-B, and an outer region that includes slots A-C-B. Each of the slots defined in the Faraday shield 108 are configured in a radial pattern that emanate from the center of the circular shaped Faraday shield 108. The circular shape of the Faraday shield 108 is defined due to the geometry of a typical wafer, which is usually circular. As is well known, wafers typically are provided in various sizes, such as 200 mm, 300 mm, 450 mm, etc.

Additionally, other shapes are possible for square type substrates or smaller substrates, depending on the etching operations performed within chamber 102. In the preferred embodiment, the Faraday shield 108 will be provided as a circular type shield, that will resemble the circular shape of a typical semiconductor wafer substrate.

Disposed above the Faraday shield 108 is the dielectric window 106. As noted above, the dielectric window 106 can be defined from a quartz type material. Other dielectric materials are also possible, so long as they are capable of withstanding the conditions of a semiconductor etching chamber. Typically, chambers operate at elevated temperatures ranging between about 50 Celsius and about 120 Celsius. The temperature will depend on the etching process operation and specific recipe. The chamber 102 will also operate at vacuum conditions in the range of between about 1 m Torr (mT) and about 100 m Torr (mT). Although not shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor wafers into and out of chamber 102 using typical automation.

Continuing with reference to FIG. 1A, the TCP coil is shown to include an inner coil (IC) 122, and an outer coil (OC) 120. The TCP coil is placed and arranged over the dielectric window 106, which is respectively placed over the Faraday shield 108. In one embodiment, the positioning of the inner coil 122 and the outer coil 120 is specifically adjusted to correlate to the location of the zones in the Faraday shield 108. For example, the outer zones of the Faraday shield 108 will be substantially positioned below the outer coils 120, of the TCP coil. The inner coil 122 of the TCP coil is positioned substantially over the middle zone of the Faraday shield 108, with partial overlap into the inner zone of the Faraday shield 108.

The correlation between the placement of the TCP coil inner structure and outer structure is strategically defined relative to the radial zones of the Faraday shield 108, so as to achieve a tuning between the Faraday Shield 108 structure and a control tuning circuitry unit 124. By tuning the placement, and power delivered to the TCP coil, relative to the zones in the Faraday shield 108, it is possible to reduce the deposition of particulates on to the exposed surface of the Faraday shield 108, within chamber 102.

In one embodiment, the TCP coil is coupled to the control tuning circuitry 124 which includes connections to the inner coil 120, and outer coil 122. As shown, the outer coil 120 outer loop is coupled to node 146, which in turn connects to variable capacitor 136. Variable capacitor 136 is disposed between node 146 and 144, before connecting to match components 128 and RF generators 126. The inner loop of the outer coil 120 is connected to node 142, which connects to capacitor 132. Capacitor 132 is coupled between ground and node 142. The inner coil 122 has its outer loops connected to node 140, which then connects to variable capacitor 134.

Variable capacitor 134 is coupled between node 140 and node 144. The inner loop of inner loop of inner coil 122 is coupled to node 148. Node 148 couples to inductor 130 that is also coupled to ground. Control tuning circuitry 124 therefore enables dynamic tuning of variable capacitors 134 and 136 to tune the power provided to the inner and outer coils when placed over the Faraday shield 108 having the above noted three zones.

In one embodiment, the control tuning circuitry 124 is configured to tune the TCP coil to provide more power to the inner coil 122 versus the outer coil 120. In another embodiment, the control tuning circuitry 124 is configured to tune the TCP coil to provide less power to the inner coil 122 versus the outer coil 120. In another embodiment, the power provided to the inner coil and the outer coil will be to provide an even distribution of power and/or control the ion density in a radial distribution over the substrate (i.e., wafer, when present). In yet another embodiment, the tuning of power between the outer coil and the inner coil will be adjusted based on the processing parameters defined for that etching being performed on the semiconductor wafer disposed over chuck 104.

In one implementation, a circuit having two variable capacitors is configured to be adjusted automatically to achieve a predetermined ratio of currents in the two coils. The ratio, in this implementation can be 0.1 to 1.5. In another implementation, the currents are about equal. In still another embodiment, the ratio is zero, such that only the outer coil is set in operation.

It should be appreciated that by providing a tunable TCP coil over a partitioned Faraday shield 108, the chamber 102 can provide more flexibility for controlling ion density versus TCP power, and radial ion density profiles, depending on the processing operations being performed. Additionally, by controlling the power to the TCP coil relative to the zones in the Faraday shield 108, it is possible to control and prevent a desired amount of deposition onto the inner surface of the Faraday shield 108, during processing. For instance, certain processing operations will tend to deposit more polymers or etching residues onto the exposed surfaces of the Faraday shield 108, within the chamber 102. In such cases, the control tuning circuitry 124 can be adjusted to influence less sputtering or deposition upon the exposed surfaces of Faraday shield 108.

In one embodiment, the capacitors 134 and 136 are controlled by processing controllers, connected to the electronics panel of chamber 102. The electronics panel can be coupled to networking systems that will operate specific processing routines that depend on the processing operations desired during specific cycles. The electronics panel can therefore control the etching operations performed in chamber 102, as well as control the specific settings of capacitors 134 and 136.

Figure 1B:
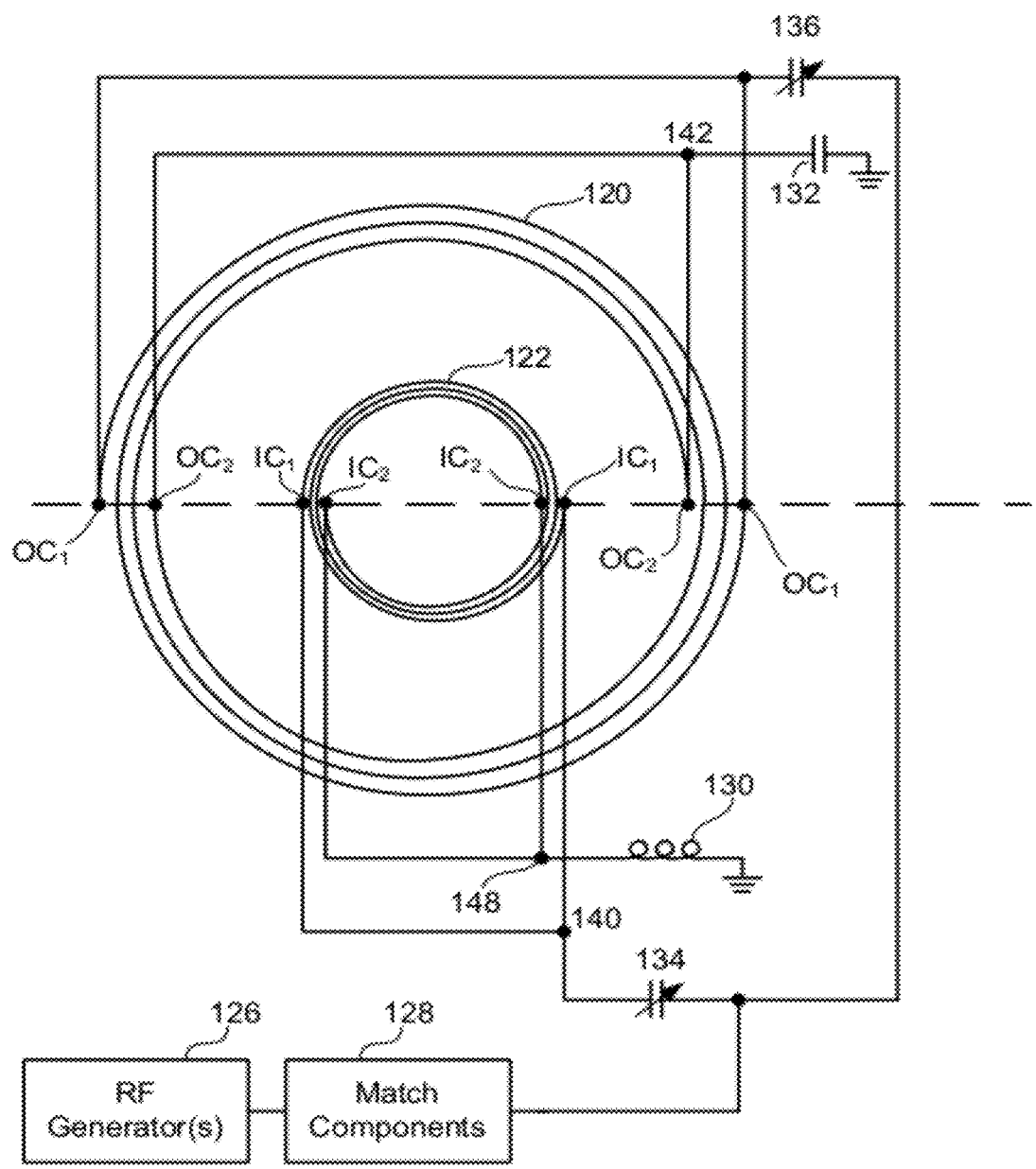
FIG. 1B illustrates a top view, schematically representing the inner coil and outer coil, in accordance with one embodiment of the present invention.

FIG. 1B illustrates a top view, schematically representing the inner coil 122 and outer coil 120, in accordance with one embodiment of the present invention. The cross-section shown in FIG. 1B represents the connections to the coil in FIG. 1A, as one example. The inner coil 122 will include an inner coil 1, and inner coil 2, an outer coil 1 and an outer coil 2. The connections between the coil ends are illustrated relative to the circuitry provided in the control to circuitry 124, as shown in FIG. 1A. The illustration in FIG. 1B was provided to show the circular winding associated with each of the inner and outer coils of the TCP coil utilized in chamber 102, in accordance with one embodiment of the present invention. It should be appreciated that other types of coil configurations are possible. It is possible to have a dimensional coil that provides a dome type structure, and other coil type structures other than flat coil distributions. Depending on the configuration associated with the geometry of the TCP coil, the specific zones in the Faraday shield 108 can be adjusted.

Figure 2:
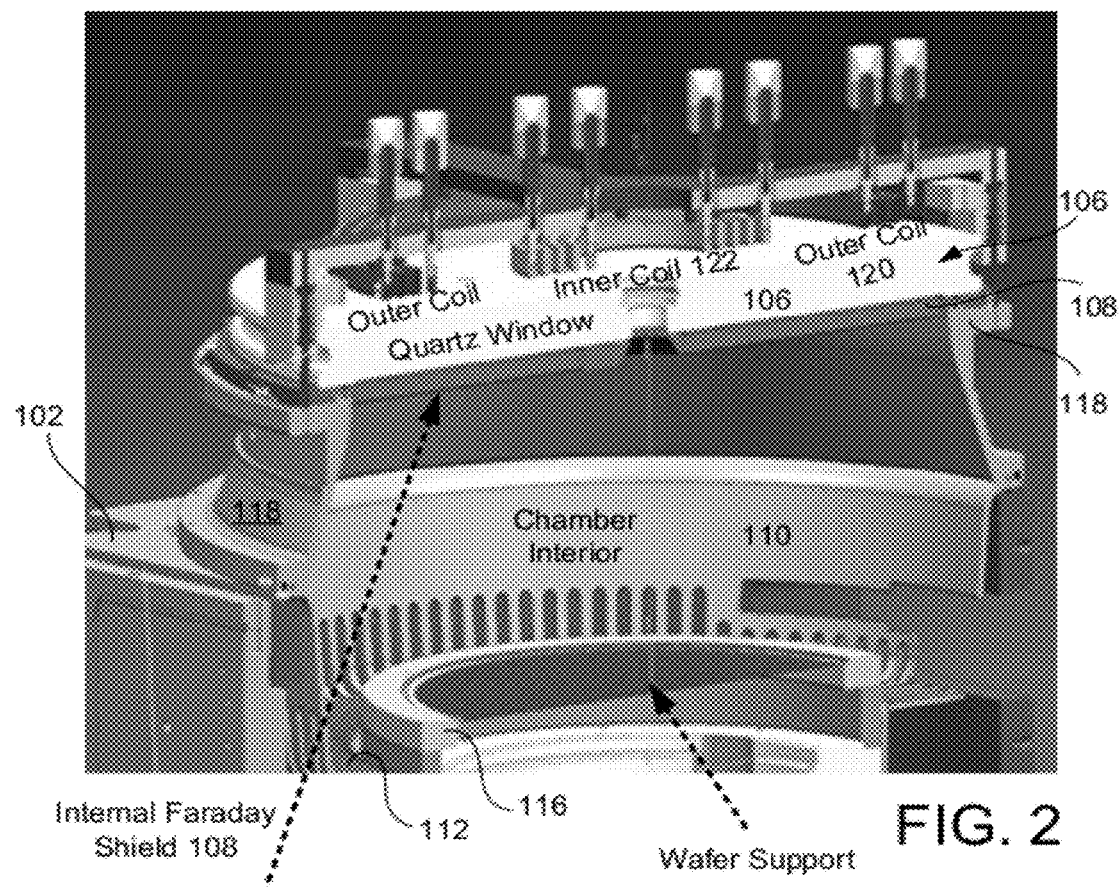
FIG. 2 illustrates a three-dimensional view of chamber, in accordance with one embodiment of the present invention.

FIG. 2 illustrates a three-dimensional view of chamber 102, in accordance with one embodiment of the present invention. As shown, chamber 102 will include the wafer support 104, also referred to as a chuck or a bottom electrode. The focus ring when 16 is also illustrated in FIG. 2, as well as a perforated plasma confinement ring 112 that enables removal of plasma byproducts from the chamber during operation, as illustrated by flow lines 114. Although not illustrated, connections are provided to chamber 102 to remove the byproducts during operation, using a variety of pump configurations which are well known in the art.

The three-dimensional view of the chamber 102 also illustrates the sidewalls of the lower liner 110 which include a plurality of slots to allow the flow of plasma byproducts during operation, while still confining the plasma over the surface of the substrate. Further illustrated is the upper liner 118 that has a tapered structure. The liner 118, is preferably connected to ground, as is chamber 102. Upper liner 118 provides the structure for supporting the Faraday shield 108 in a tight relationship to the upper liner 118. The tight relationship is preferably established by O-rings that ensure proper connection between the Faraday shield 108 and the upper liner 118, while still providing for electrical conduction to provide ground to the Faraday shield 108. As illustrated, the dielectric window 106 (preferably a quartz window) is provided over the Faraday shield 108.

The three-dimensional view of FIG. 2 also illustrates the placement of the outer coil 120 and the inner coil 122. Electrical connections are also shown made to the inner and outer coils, which allow for interconnection to the control tuning circuitry 124. The control circuitry 124 can include the RF generators 126 and match components 128, or these components can be excluded from the control tuning circuitry 124. The configuration of the tuning circuitry can be defined using separate circuitry and/or software that is interfaced to controlling systems of chamber 102.

Figure 3:
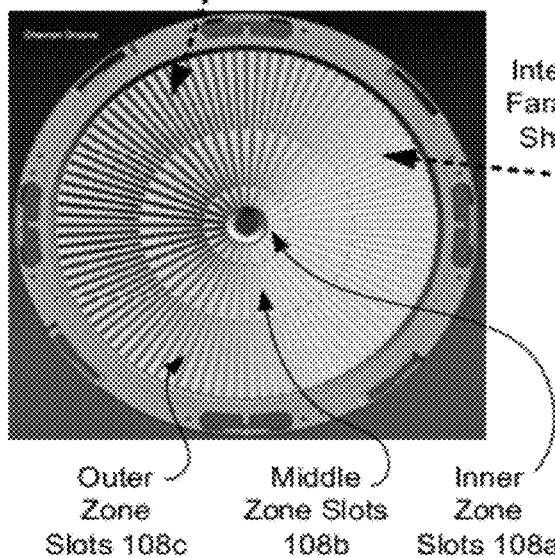
FIG. 3 illustrates a bottom view of Faraday shield, in accordance with one embodiment of the present invention.
Figure 4:
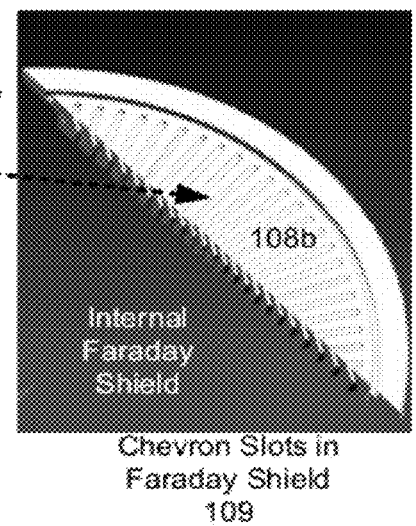
FIG. 4 illustrates a cut section of the Faraday shield, exposing the chevron slots of the Faraday shield, in accordance with one embodiment of the present invention.

FIG. 3 illustrates a bottom view of Faraday shield 108, which is exposed to the inner region of chamber 102, in accordance with one embodiment of the present invention. FIG. 4 illustrates a cut section of the Faraday shield 108, exposing the Chevron slots 109 of the Faraday shield 108. As shown, the Faraday shield 108 includes several zones of radial slots. The radial slots are defined by Chevron grooves and, the zones are distributed between inner, middle, and outer regions of the Faraday shield 108. As noted above, a correlation is defined between the placement of the zones of the Faraday shield 108, and the inner and outer coils of chamber 102. Further, the inner and outer coils of the TCP coil are interfaced to control tuning circuitry 124 that enables control of energy delivered to the chamber to effect the desired etching operations with precision. In one embodiment, the inner zone slots are referred to as slots 108a, the middle zone slots are referred to as slots 108b, and the outer zone slots are referred to as lots 108c. As noted in FIG. 1A, a relationship exists between the placement of the outer coil 120 and the inner coil 122, relative to the three zones of the Faraday shield 108.

Figure 5:
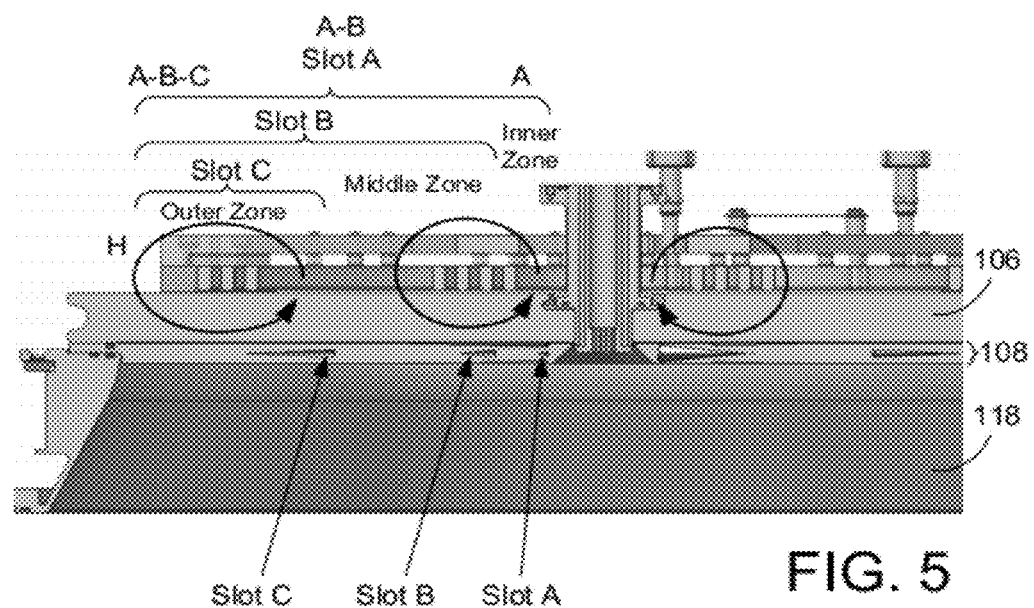
FIG. 5 illustrates another embodiment of the present invention in a three-dimensional illustration.

FIG. 5 illustrates another embodiment of the present invention in a three-dimensional illustration. As shown, the placement of the outer TCP coils and inner TCP coils are correlated to the outer zone, the middle zone, and the inner zone. In the outer zone, slots A-B-C are present, while in the middle zone, slots A-B are present, and only slots A are present in the inner zone. As illustrated, the open area is greater than 25% at all locations under the outer coil. Open area is defined as an area that provides passage for energy flux generated by the coil that is coupled to the RF generator, and associated matching circuitry. As shown, slot C extends beyond the region where the highest horizontal flux from the outer coil can be seen. Slot B maintains an open area of greater than 25% through the region under the inner coil. Slot A extends beyond the region where the highest horizontal flux from the inner coil can be seen.

Figure 6:
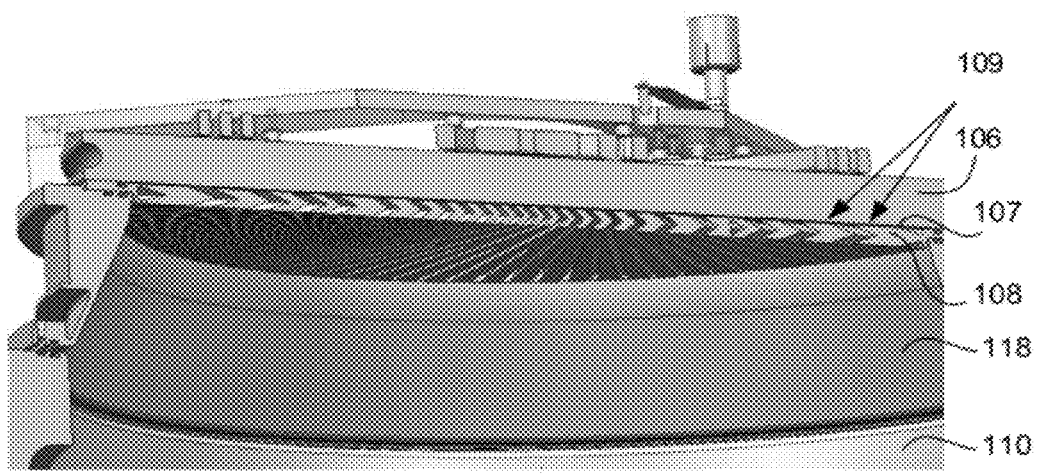
FIG. 6 illustrates a cross-sectional view of the topmost section of the inner chamber, in accordance with one embodiment of the present invention.

FIG. 6 illustrates a cross-sectional view of the topmost section of the inner chamber 102, in accordance with one embodiment of the present invention. This illustration shows the Faraday shield 108 having the Chevron patterns 109, discussed above. The Faraday shield 108 is separated from the dielectric window 106 by space 107. In one embodiment, the space distance can be between about 0.3 mm and about 1.5 mm. Preferably, the space distance is about 0.5 mm. As used herein, the preferable distance is represented for an etching chamber that is processing a 300 mm wafer. As chambers can vary from smaller to larger chambers, the distances, and parameters provided in this application will vary depending on the size and geometry of the substrate being processed.

Figure 7:
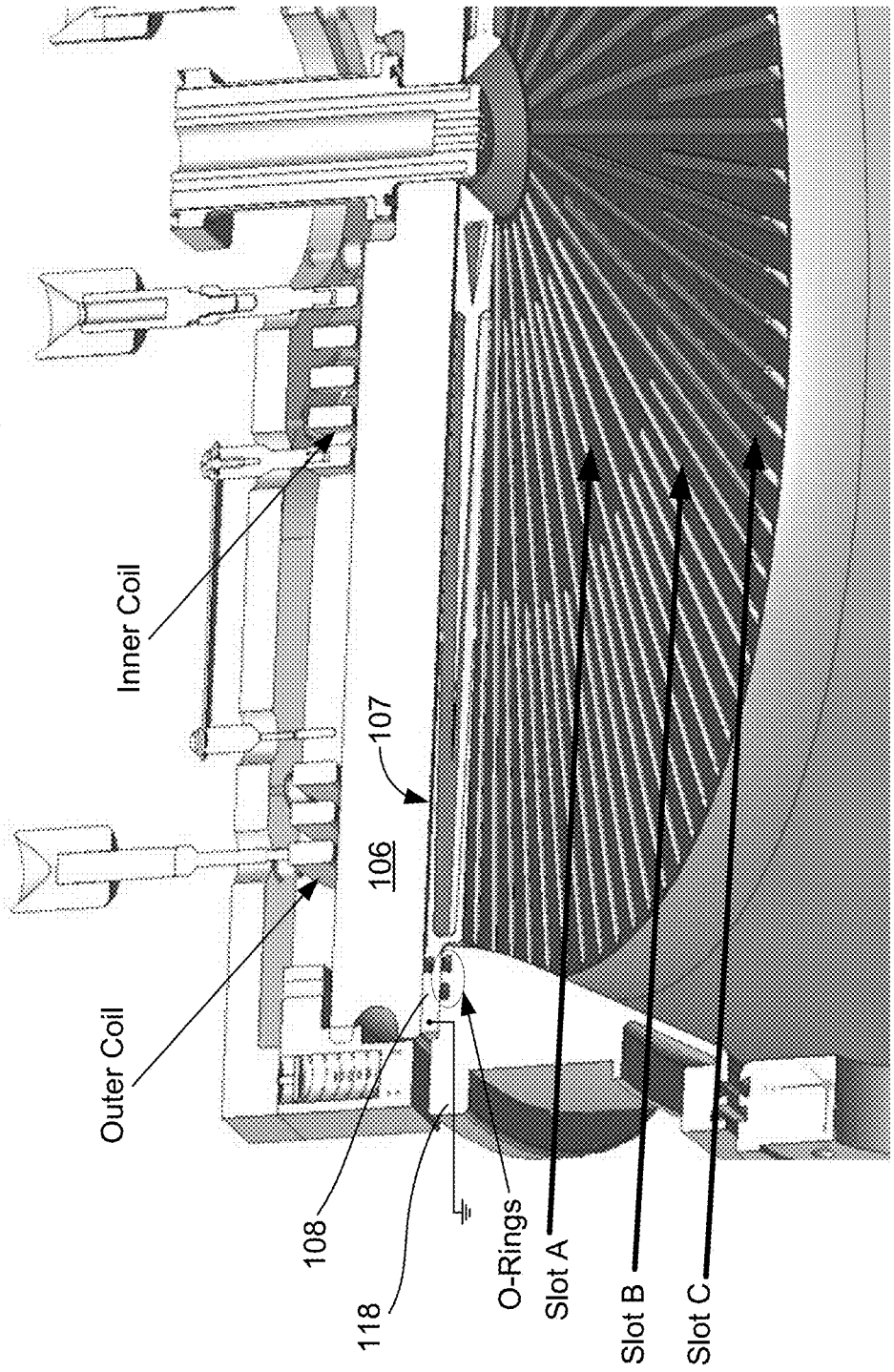
FIG. 7 illustrates a more detailed view of the underside of the coil and the slots A, B, and C, in accordance with one embodiment of the present invention.

FIG. 7 illustrates a more detailed view of the underside of the coil 108 and the slots A, B, and C, in accordance with one embodiment of the present invention. As shown, slot A is a slot that defines a Chevron groove in the Faraday shield 108 that extends across the inner, middle, and outer zones of the Faraday shield 108. Slot B is a slot that defines a Chevron groove in the Faraday shield 108 that extends across the outer zone, and the middle zone. Slot C is a slot that has a Chevron groove in the Faraday shield 108 that extends across only the outer zone. In a preferred embodiment, the distribution of slots A, B, and C are configured to a specific pattern. The specific pattern, in one embodiment is A,C,B, C, A,C,B, C, A,C,B C, AC,B, . . . etc.

Figure 8:
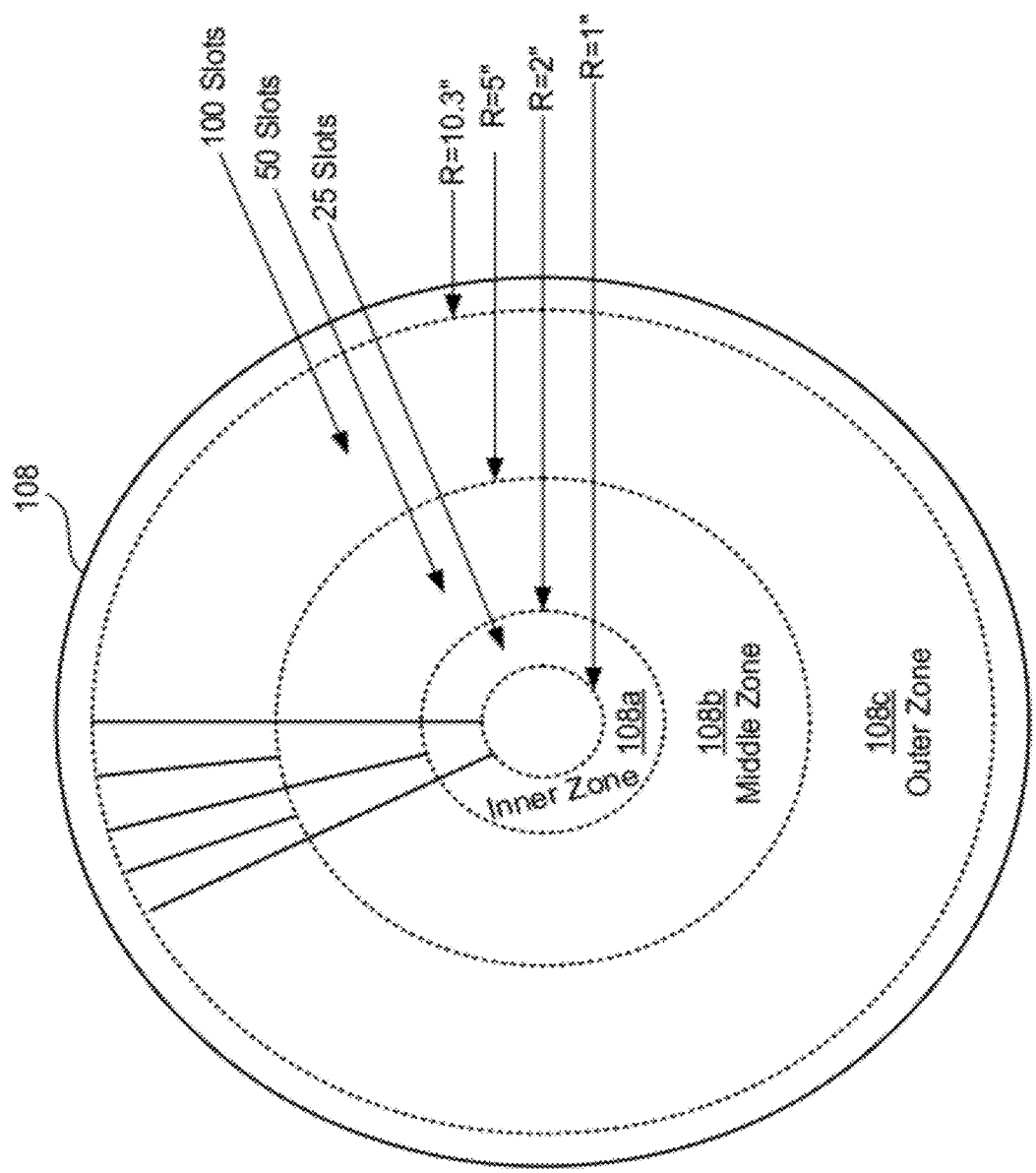
FIG. 8 illustrates a top view of the distribution of the Faraday shield slots, in accordance with one embodiment of the present invention.

FIG. 8 illustrates a top view of the distribution of the Faraday shield slots, in accordance with one embodiment of the present invention. As shown, the Faraday shield is divided into three zones. The inner zone 108a is closest to the center hole of the Faraday shield. The middle zone 108b is between the inner zone 108a and the outer zone 108c. In one embodiment, the inner zone 108a will include 25 slots. The middle zone 108b will include 50 slots, and that outer zone 108c will include 100 slots. As noted above, the slots are preferably defined in a radial pattern that alternate with a pattern of A,C,B, C, A,C,B, C, A,C,B C, A,C,B, . . . etc.

FIG. 9A illustrates the path of image current under the inner coil, in accordance with one embodiment of the present invention. As shown, the Faraday shield 108 will have the outer coil 120 and the inner coil 122, disposed above the Faraday shield. As noted, the inner and outer coils will be disposed above the dielectric window 106, such that the coils are outside of chamber 102 and the Faraday shield 108 is inside the chamber 102, and exposed to the processing environment, such as the bulk plasma during an etching operation. As shown, the inner zone will only include slot A, the middle zone will include slots A and B, and that outer zone will include slots A, B, and C. The approximate positioning of the inner and outer coils 122 and 120 are shown in FIG. 9A, relative to the inner, outer, and middle zones. FIG. 9B illustrates an example of a portion of current going around rather than through slot B, which is minimized by the proximity of slot A, reducing Ohmic losses and improving the flux penetration from the inner coil.

The spacing for the slots therefore provides advantages over prior designs that don't correlate to the placement of the coils. In one embodiment, the large spacing of slots makes it more likely that the image current will go around the end of the slot, not through the slot which is what is desired to maximize magnetic flux transmission. The result would be more heating of the shield and less heating of the plasma. By adding slots A that rapidly diverge from the center of the shield outwards, the slot count is increased by the start of the B slots, and then the start of the C slots in the outer zone. In this way, a balance is made between the desire to transmit magnetic flux to the plasma, reductions in heat buildup on the shield, and protection of the dielectric window 106 from plasma byproducts.

Figure 10A:
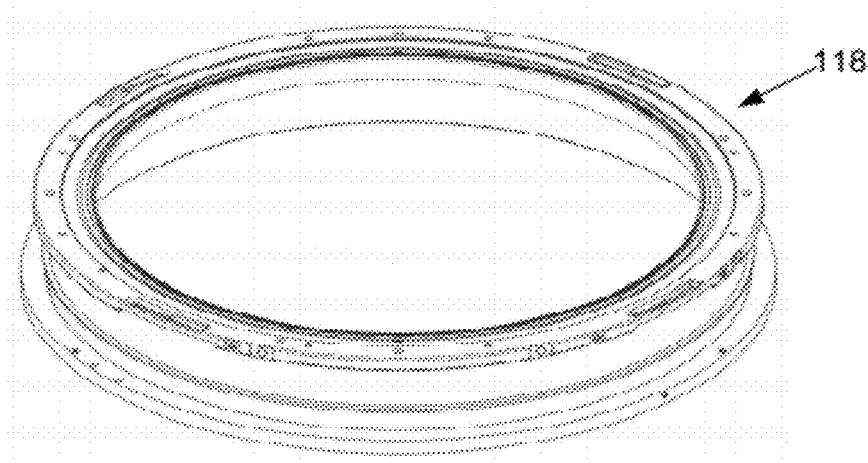
FIGS. 10A and 10B illustrate a three-dimensional view of the upper liner 118, of chamber 102, in accordance with one embodiment of the present invention.
Figure 10B:
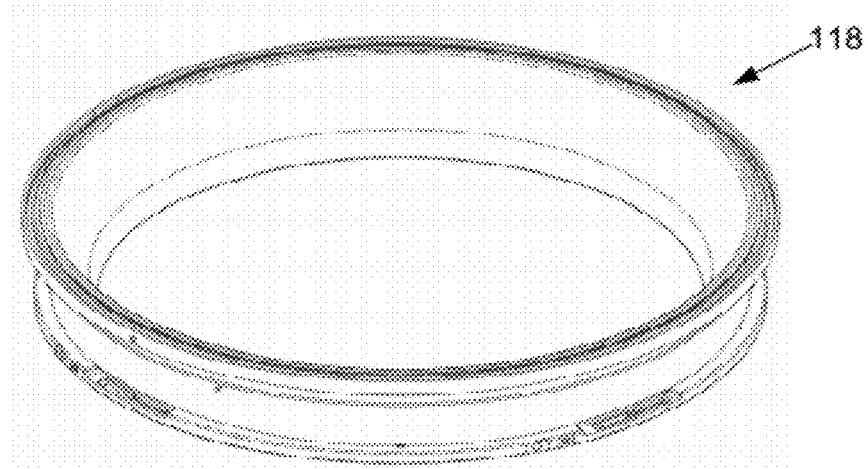

FIGS. 10A and 10B illustrate a three-dimensional view of the upper liner 118, of chamber 102. As shown, the upper liner 118 will have a tapered profile, and the top isometric view will provide a shelf for securing the Faraday shield 108, when assembled to chamber 102. The bottom isometric view of top liner 118 will connect to the lower liner 110, as shown in FIG. 1A and FIG. 2.

Figure 11A:
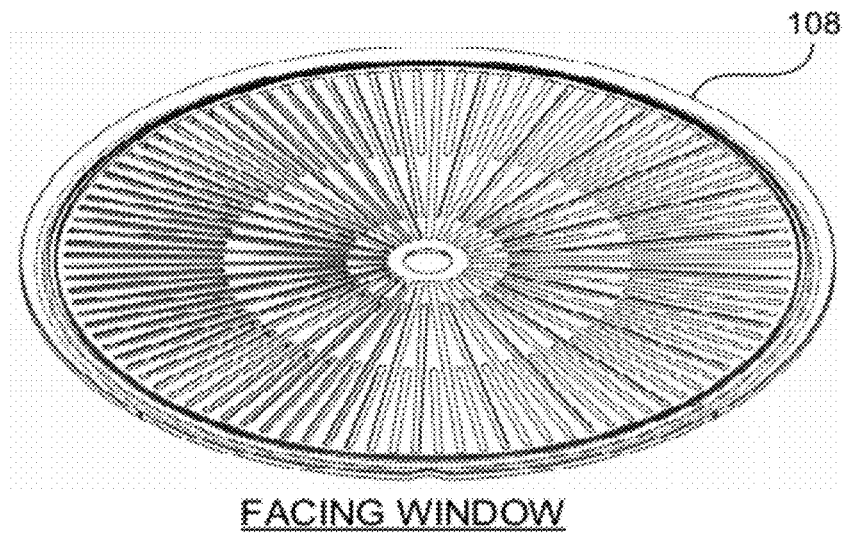
FIGS. 11A-B illustrate a three-dimensional view of the Faraday shield, in accordance with one embodiment of the present invention.
Figure 11B:
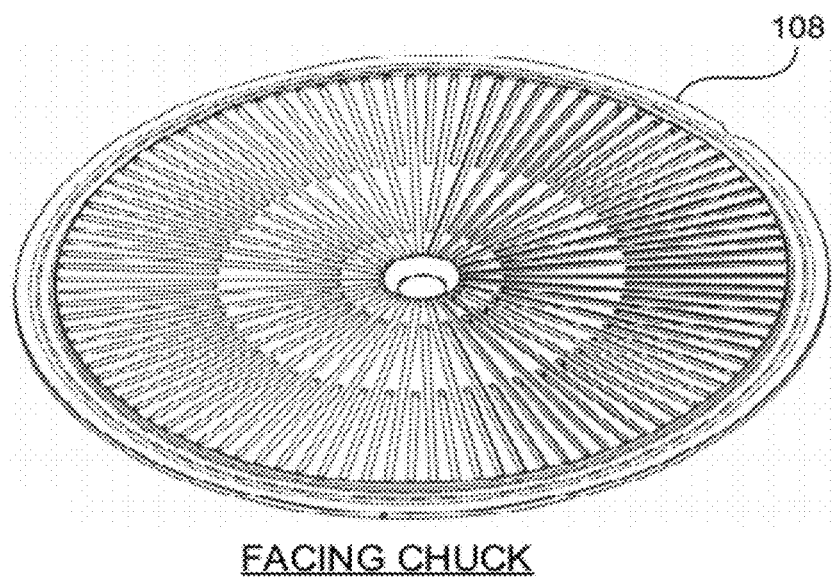

FIG. 11A illustrates a top view of the Faraday shield 108, in accordance with one embodiment of the present invention. The top view of the Faraday shield 108 represents the side facing the window 106 of chamber 102, when assembled in chamber 102. FIG. 11B shows the side of the Faraday shield 108 that faces the chuck 104, as shown in FIG. 1A. The side facing chuck 104 is the side that will be exposed to the processing gases and plasma during etching operations. FIGS. 11A and 11B, clearly illustrate the three zones of the Faraday shield and the radial configuration of the slots of the Faraday shield 108. Also illustrated are the slots that are defined in a Chevron pattern, thus preventing the line of sight to the dielectric window 106, for blocking process particulates and byproducts during etching operations.

Figure 11C:
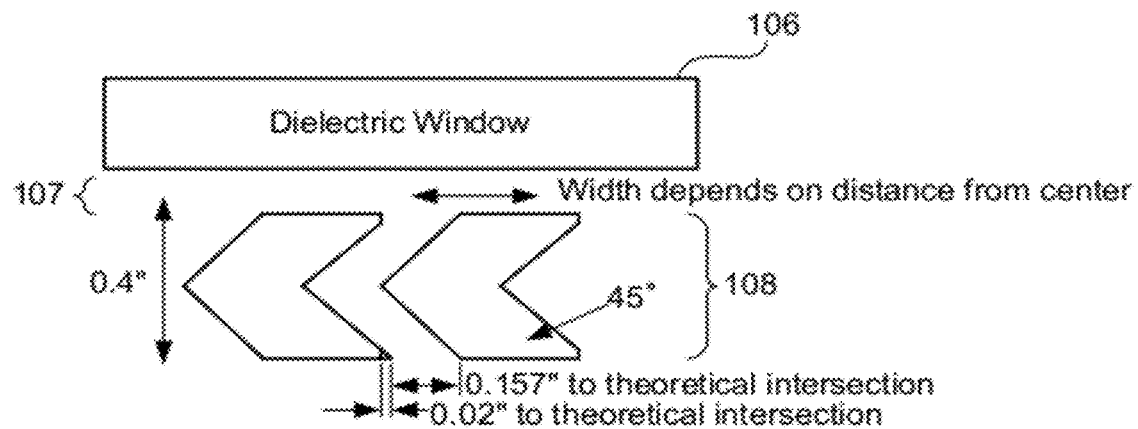
FIG. 11C illustrates a top view of the Faraday shield, in accordance with one embodiment of the present invention.
Figure 11D:
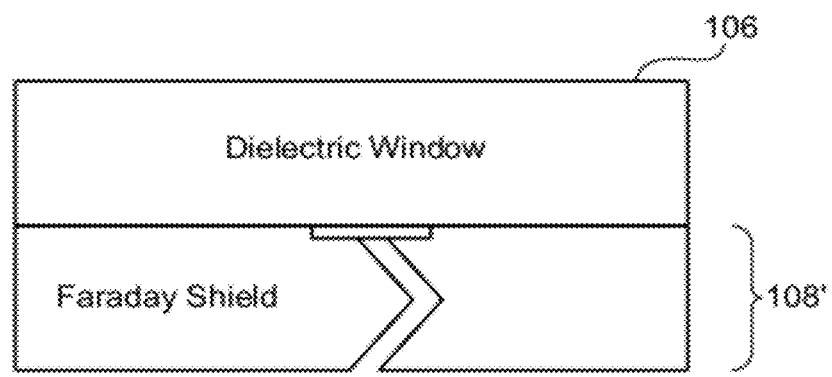
FIG. 11D illustrates another embodiment where the Faraday shield is disposed proximate or completely in contact with the dielectric window.

FIG. 11C illustrates one embodiment of the Faraday shield 108, in accordance with one embodiment of the present invention. This illustration shows the Faraday shield 108 having the Chevron grooves formed therein. Also illustrated are exemplary dimensions for the Faraday shield 108, so that the line of sight to the dielectric window 106 can be blocked for process particulates during etching operations. Again, the sizing illustrated for the Faraday shield 108 is exemplary in nature, and is particularly tied to the dimensions necessary for a 300 mm wafer, that is being processed in an etching operation. If the wafer is either reduced in size or increased, the Faraday shield 108 and the dimensions of chamber 102 will likewise be adjusted for the varying in size of the substrate. FIG. 11C illustrates another embodiment where the Faraday shield 108' is disposed proximate or completely in contact with the dielectric window 106. In contrast with the embodiment of FIG. 11 A, the Faraday shield 108 is maintained at a space 107 between dielectric 106. The space 107 can vary between about 0.3 mm and about 1.5 mm. And preferably is set to about 0.5 mm.

In one embodiment, the Faraday shield is made out of stainless steel. For example, the Faraday shield is made out of 300-series stainless steel (i.e. one of the following SS materials: 301, 301LN, 304, 304L, 304LN, 304H, 305, 312, 316, 316L, 316LN, 316Ti, 317L, 321, 321H). In one embodiment, the stainless steel Faraday shield is passivated with nitric acid for improved corrosion resistance. The Faraday shield can be made out of Hastalloy. The Faraday shield can be made out of Titanium. In this embodiment, the Titanium Faraday shield is coated with TiN for better corrosion performance. The Faraday shield can be coated with one of the following materials: Y2O3, CeO2, TiN (independent of the material of construction). In another embodiment, a plurality of circular grooves is machined into the surface of Faraday shield facing the plasma to enhance the surface area for adhesion. In one embodiment, grooves are between 0.1 mm and 10 mm wide and between 0.1 mm and 5 mm deep. The distance between grooves can be between 0.1 mm and 10 mm (independent of the material of construction). A plurality of radial grooves can be machined into the surface of Faraday shield facing the plasma to enhance the surface area for adhesion. Grooves can be between 0.1 mm and 10 mm wide and between 0.1 mm and 5 mm deep (independent of the material of construction). The Faraday shield surface Ra can be between 5 and 300 micro-inches. In a preferred embodiment, circular machining lay pattern is achieved on the surface. The Faraday shield surface Ra can be between 16 and 300 micro-inches, obtained using bead-blasting (independent of material of construction). In an alternate embodiment, the Faraday shield is in contact with the dielectric window, and the area around the chevron is grooved. The groove can be 0.5-5 mm deep, and 0.5-5 mm wide. In one embodiment, the dielectric window is made of quartz or other dielectric materials.

Figure 12:
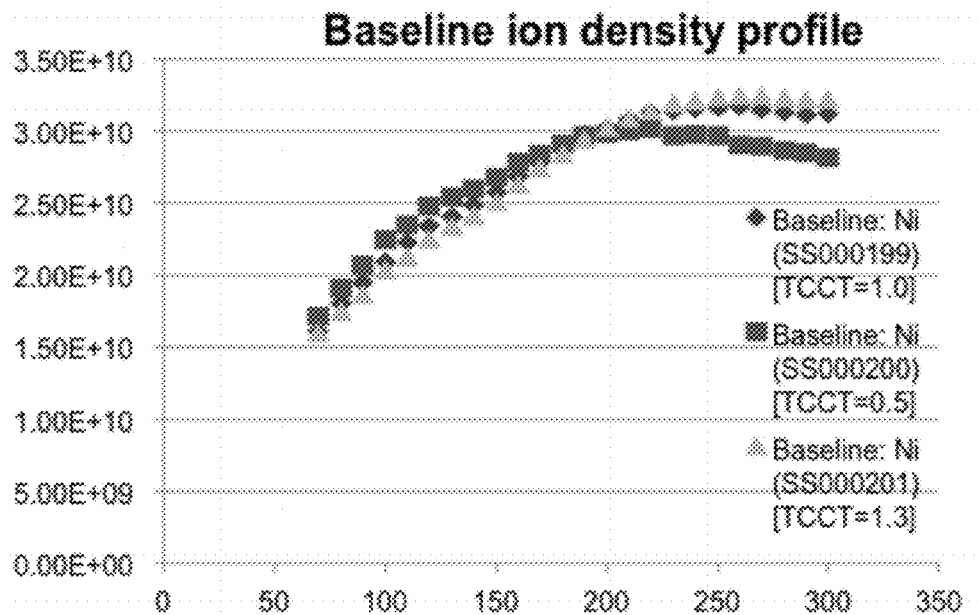
FIGS. 12 and 13 illustrate baseline ion density profile plots.
Figure 13:
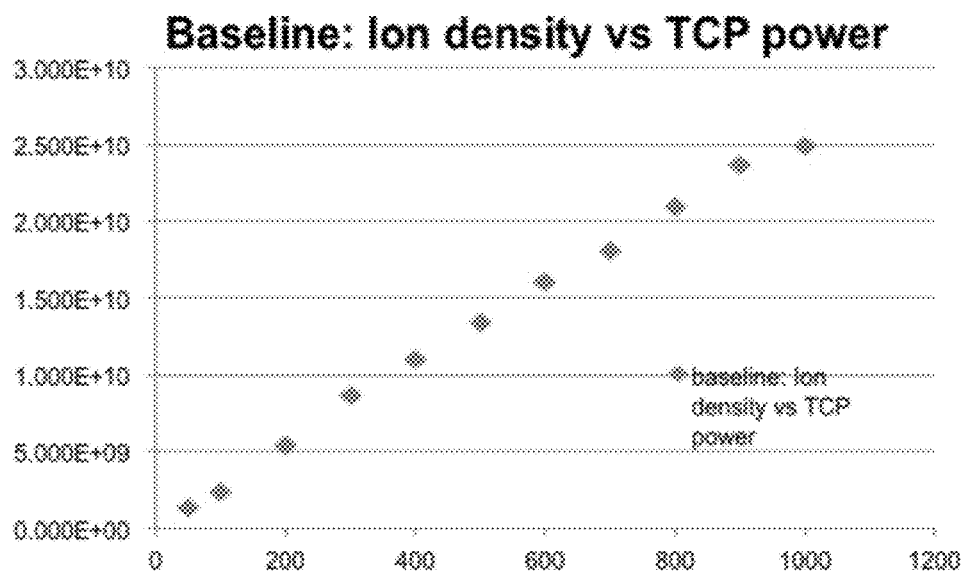

FIG. 12 illustrates a baseline ion density profile plot, utilized to test the performance of a plasma density within a process chamber, when no Faraday shield is installed. In this experiment, the baseline plasma density profiles were obtained using a process chamber manufactured by Lam Research Corporation, the assignee of the present application. The process chamber was a 2300 Versys Kiyo 45, which was configured without the Faraday shield 108. The test conditions included flowing Ar at 200 sccm, SF6 at about 50 sccm, chamber pressure of 9 mT, and a transformer coupled capacitive tuning (TCCT) at 1.0. Modifying the TCCT enables changing of the lateral plasma density distribution via independently biasing of the inner and outer coils of the TCP coil. For example, the higher the value of TCCT, more power is directed toward the center segment of the TCP coil. Typical operational ranges are between 0.1 and about 1.5. However, in order to impart good control via TCCT settings, it is imperative that the dielectric window remain substantially clean of etch by-products. The ion density power sweep and TCCT ion density profile collected is illustrated in FIG. 12 and FIG. 13. Further, the testing was performed where plasma ignition was controlled at a transformer coupled plasma (TCP) power of about 50 W.

Figure 14:
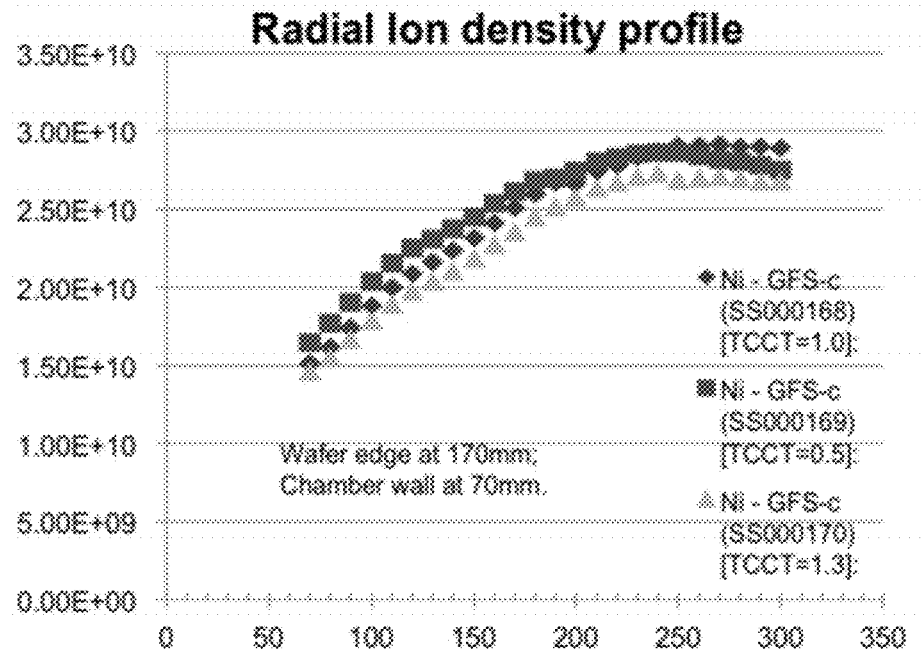
FIGS. 14 and 15 illustrate the results from utilizing an internal Faraday shield, within the process chamber 102, in accordance with one embodiment of the present invention.
Figure 15:
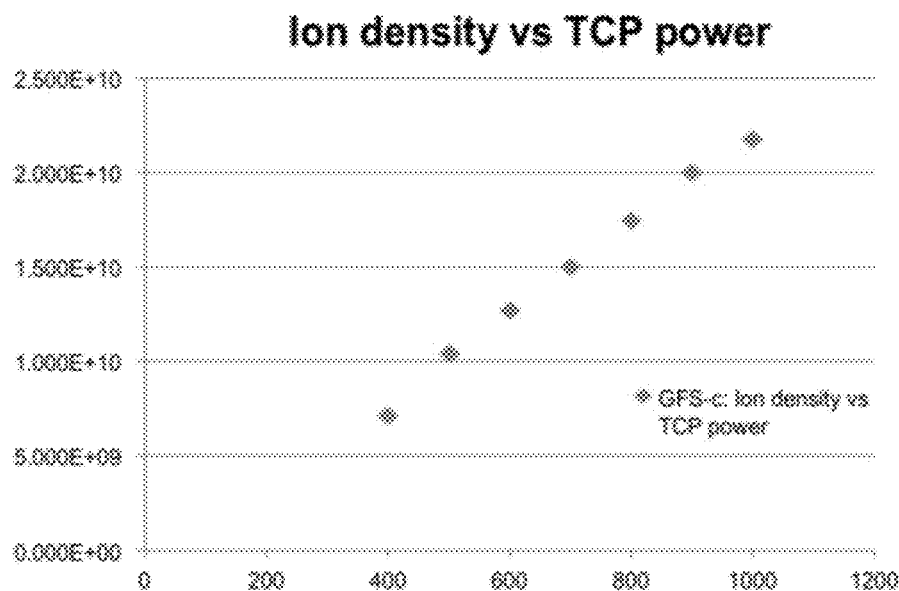

FIGS. 14 and 15 illustrate the results from utilizing an internal Faraday shield 108, within the process chamber 102, in accordance with one embodiment of the present invention. As noted above, the Faraday shield 108 will include radial slots having three zone distribution between the inner, middle, and outer zones, and the zones are correlated to the placement of RF coils that are tuned to maintain the proper power distribution and flux to ignite and maintain optimal ion density profiles. As shown, the ignition window for the TCP was a minimum of about 500 W with Argon at a minimum of about 300 sccm at a pressure of 9 mT. The stable plasma operational window was where TCP was set at a minimum of about 400 W and argon of about 200 sccm/50 sccm SF6, and a pressure of about 9 mT. This test configuration confirmed that having the Faraday shield 108 installed within the process chamber did not significantly impact the plasma density, and TCCT to the ability was still observed. In this experiment, it was shown that not more than about 15% reduction in plasma density was observed when the Faraday shield 108 was installed inside the chamber. Thus, the introduction of the Faraday shield 108 within a chamber 102, with its three zone radial distribution, still allows for precision control of plasma density profiles within the chamber, while assisting in the reduction of plasma byproducts on the dielectric window 106. Maintaining the dielectric window 106 clean of byproducts will therefore increase the operational use of chamber 102, and reduce excessive clean operations.

In one embodiment, clean operations can include waferless auto clean (WAC), which are configured to remove plasma byproducts from the inside surfaces of the chamber in between wafer processing cycles. In another embodiment, even though less byproducts are deposited on the Faraday shield 108, due to its geometric configuration and orientation relative to the RF TCP coil and tuning circuit, when byproducts eventually accumulate, easy replacement of the Faraday shield 108 can be made with little downtime of the etching chamber 102.

Figure 16:
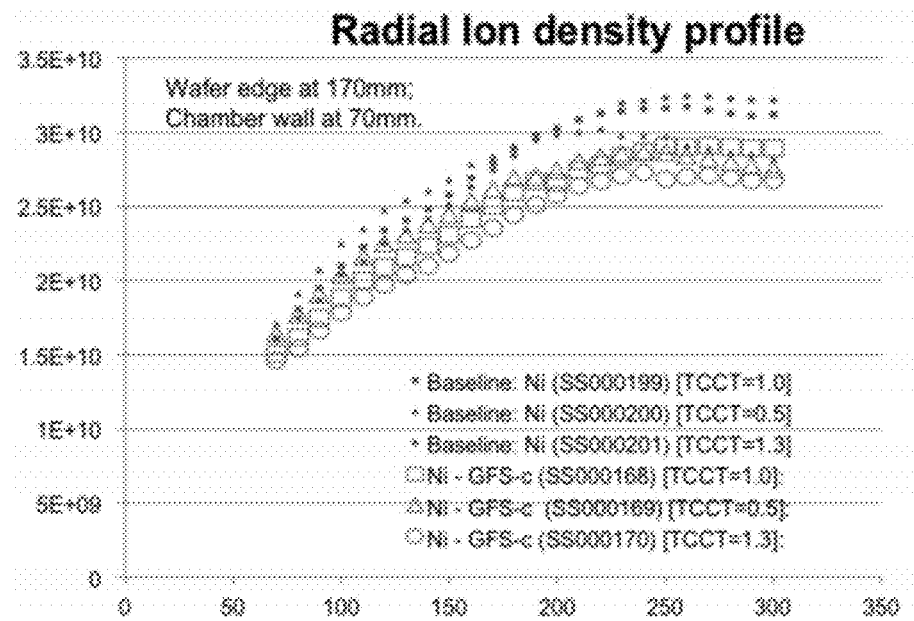
FIGS. 16 and 17 illustrate a comparison between an embodiment where the Faraday shield is installed within the chamber and when Faraday shield is not installed within the chamber, in accordance with one embodiment of the present invention.
Figure 17:
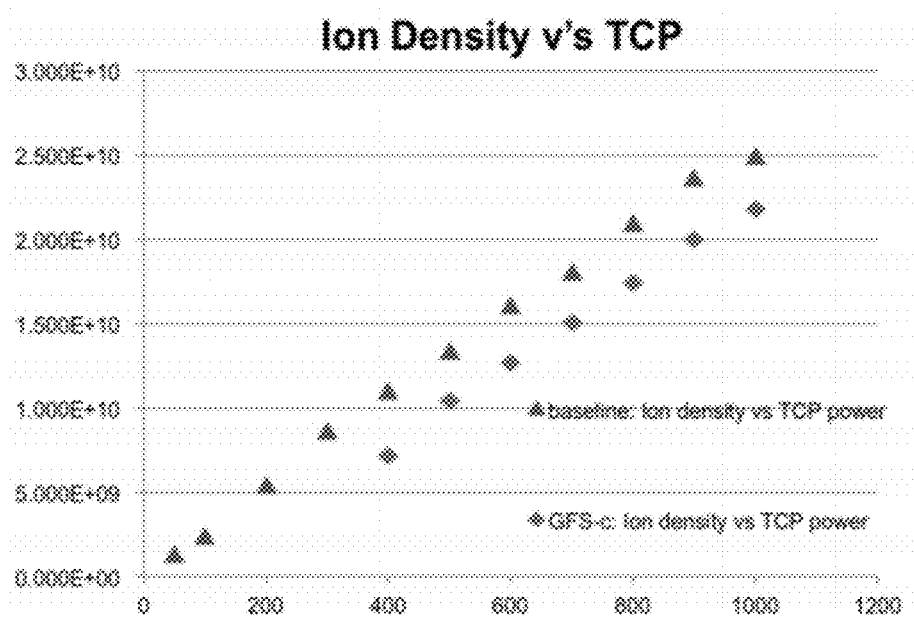

FIGS. 16 and 17 illustrates a comparison between an embodiment where the Faraday shield 108 is installed within chamber 102 and when Faraday shield 108 is not installed within chamber 102, in accordance with one embodiment of the present invention. In this example, it is shown that just a slight higher plasma density and lower ignition window is possible when the Faraday shield 108 is not installed in chamber 102. However, the Faraday shield does not cause significant B-field (magnetic field) attenuation. Preventing magnetic field attenuation is an important factor, when considering that the Faraday shield 108 is being placed inside the chamber 102 opposite the RF coils that provide the magnetic flux to drive the plasma generation within the chamber. As a result, it is confirmed that the Faraday shield 108 installed within the process chamber 102, with the defined radial distribution and grooved Chevron structure, still enables for precision controlled ion density profiles across a radial distribution. Additionally, the Faraday shield 108 acts to reduce the sputtering or accumulation of plasma byproducts onto the dielectric window 106.

Figures 18A, 18B, 18C:
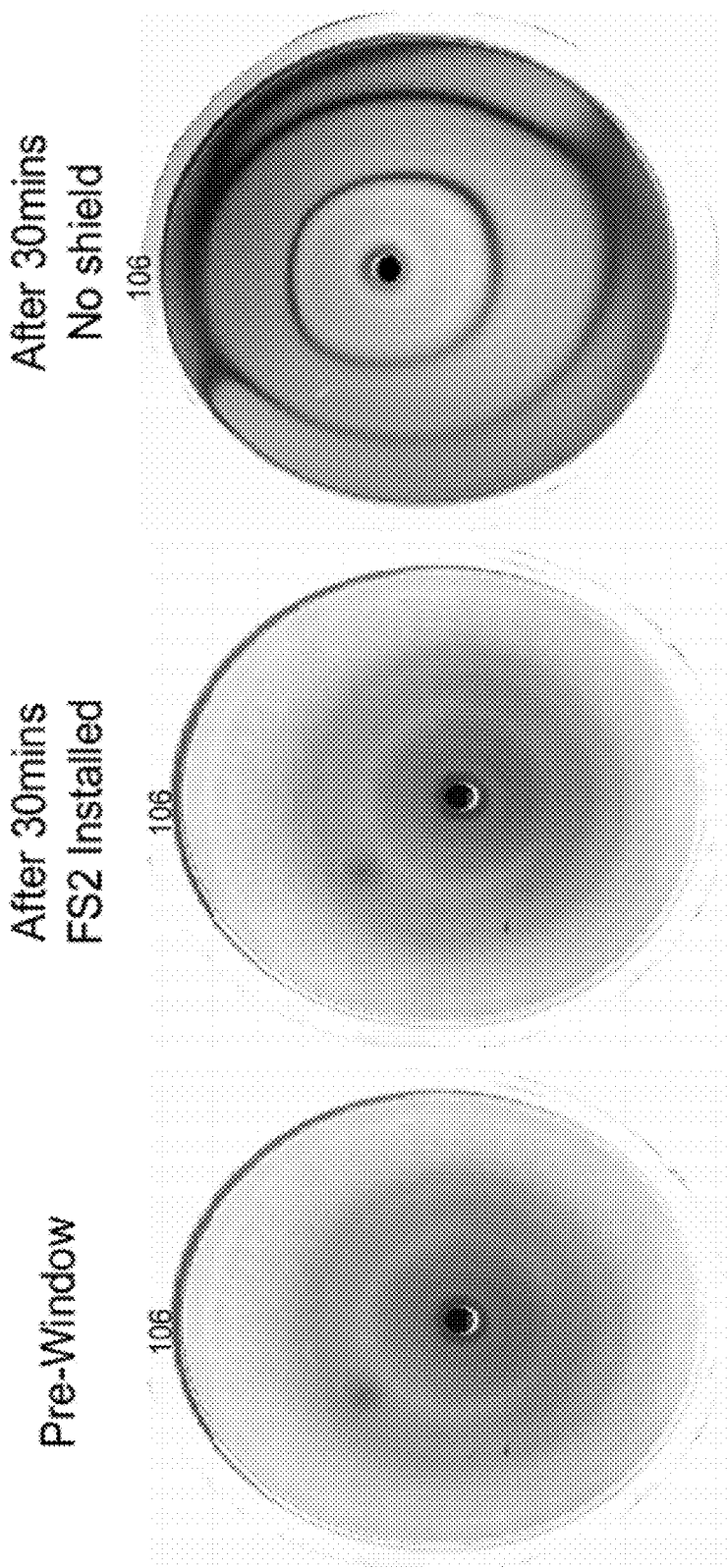
FIGS. 18A-C show the experimental results on dielectric window.

As shown in FIGS. 18A-C, the experimental results show that the dielectric window 106, when protected by the Faraday shield 108 will prevent deposition of etch byproducts, which could significantly impact the operational parameters and control of etching operations in chamber 102. As shown, the pre-window picture of the dielectric window 106 will look substantially identical to the dielectric window 106 after 30 min of operation when etching a substrate having aluminum material. Without the Faraday shield 108 installed within chamber 102, after 30 min of operation, the alumina material (byproducts from etching) will significantly deposit on the surface of the dielectric window 106. The significant amount of deposition on the surface of the window 106 within chamber 102, when no Faraday shield 108 is installed, will require substantial downtime for cleaning operations, as well as loss of operational control in process critical tuning regimes.

Figure 19B:
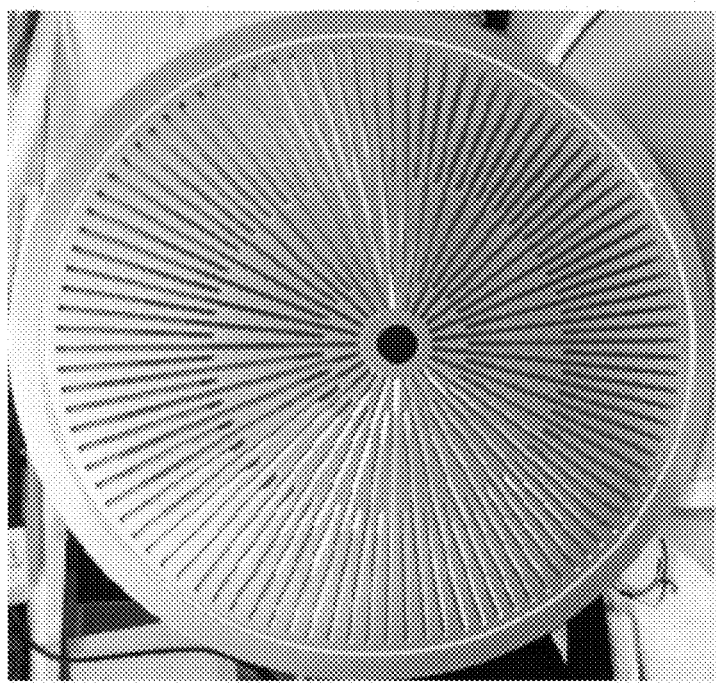
FIGS. 19A and 19B, illustrate a condition of Faraday shield after the processing operations performed during the aluminum etching described in FIGS. 18A-C, in accordance with one embodiment of the present invention.
Figure 19A:
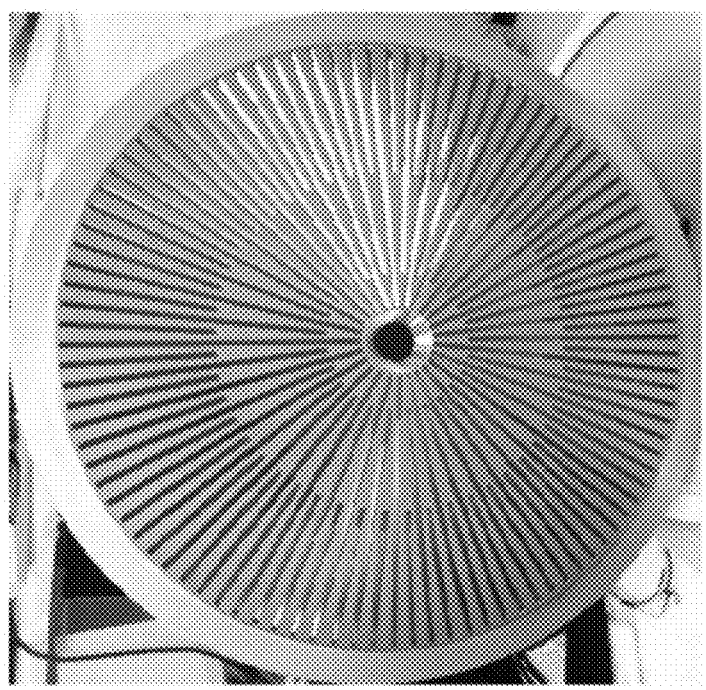

FIGS. 19A and 19B, illustrate the condition of Faraday shield 108 after the processing operations performed during the aluminum etching described in FIGS. 18A-C, in accordance with one embodiment of the present invention. FIG. 19A shows that the surface facing the process side of the chamber received little deposition of aluminum, due to the configuration of the slots, the placement of the TCP coils, and the tuning circuitry 124 (as shown in FIG. 1A). FIG. 19B illustrates that the top surface of the Faraday shield 108 accumulated substantially no deposition material, confirming that any etch byproducts directed toward parity shield 108 will be prevented from reaching the dielectric window 106.

Accordingly, it has been confirmed that the geometric configuration of the slots on the Faraday shield 108, coupled with the Chevron grooves substantially prevents deposition of byproducts to flow to the dielectric window 106, 1 installed in chamber 102. Additionally, the placement of the TCP coils (inner and outer) relative to the three zones of slots in the Faraday shield 108 provide control by the tuning circuitry 124, to properly drive the desired ion density profiles within the chamber, while preventing excessive deposition of etch byproducts onto the exposed surface of the Faraday shield 108.

In one embodiment, the tuning capacitors of circuit 124 are configured to produce a current that is correlated and placed above the Faraday shield 108. The placement of the inner and outer coils is therefore correlated to the zones of the Faraday shield to provide the optimal transfer and tunability of magnetic flux to the plasma in the chamber 102. In one embodiment, the outer coil 120 is placed substantially over the outer zone, which includes the slots A-C-B, and also has the most open space for transmission of magnetic flux to the plasma. The inner coil 122 is placed substantially over the middle zone, where fewer slots of A-B are provided, but more than the inner zone. In one embodiment, the inner coil 122 can be defined slightly over the inner zone A. However, in one configuration, the inner coil 122 is substantially aligned over the middle zone of the Faraday shield.

In still another embodiment, depending on the process parameters of the etch operation, it is possible to adjust the tuning capacitors to ratios that influence less deposition on the inner surface of the Faraday shield 108. It is believed, that due to the placement of the outer coil 120 over the outer zone of the Faraday shield and the inner coil 122 over the middle zone, it is possible that the magnetic field around the grounded Faraday shield 108 will influence less deposition on the exposed surface of the Faraday shield 108.

As illustrated by FIGS. 1A-19B, the Faraday shield can be configured in a variety of ways. The Faraday shields are provided as examples and should not be considered as limiting to the present invention. The number of slots, slot shapes, and slot sizes in the Faraday shields can be varied as necessary to accommodate different etching process requirements.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A plasma processing chamber, comprising:
   an electrostatic chuck for receiving a substrate;
   a chamber liner surrounding the electrostatic chuck and coupled to a wall of the plasma processing chamber, the wall of the processing chamber being electrically connected to ground;
   an upper liner coupled to the chamber liner and being electrically connected to ground via the chamber liner and the wall of the processing chamber, the upper liner has a tapered profile that is gradually thinning along a downward direction that is toward the chamber liner, the tapered profile provides an angle that is away from a center of the chamber;
   a Faraday shield having an outer edge that is configured for support on a lowered upper surface of the upper liner, the lowered upper surface including O-rings that provide electrical conduction for the Faraday shield to ground;
   a dielectric window placed over the outer edge of the Faraday shield, wherein other than the outer edge where the dielectric window is placed over, a space is defined separating the Faraday shield from the dielectric window, and the dielectric window is disposed at a top portion of the chamber, the dielectric window being oriented above the electrostatic chuck, wherein the Faraday shield is disposed inside of the chamber and under the dielectric window so as to be defined between the electrostatic chuck and the dielectric window, the Faraday shield includes,
   (a) an inner zone having an inner radius range that surrounds a center hole that bounds an inner edge;
   (b) a middle zone having a middle radius range;
   (c) an outer zone having an outer radius range, the inner zone being adjacent to the middle zone, and the middle zone being adjacent to the outer zone;
   (d) a first set of radial slots (A) extending through the inner zone, the middle zone, and the outer zone;
   (e) a second set of radial slots (C) extending through only the outer zone; and (f) a third set of radial slots (B) extending through the middle zone and outer zone, wherein the first, second and third sets of radial slots are consecutively arranged radially around the Faraday shield in a repeating pattern of slots A, C, B, and C, the outer edge of the Faraday shield surrounds the outer zone, such that the repeating pattern of slots A, C, B, C do not extend into the outer edge and the first set of radial slots A do not extend into the inner edge;

transformer coupled plasma (TCP) coils disposed over the dielectric window, the TCP coils includes an inner coil and an outer coil, each of the inner coil and outer coil has a flat coil distribution with a circular winding, wherein, the outer coil is disposed over the dielectric window and is oriented over the outer zone of the Faraday shield that includes consecutively repeating slots A, C, B, and C to define an open area under the outer coil in the outer zone to provide passage for magnetic flux generated by the outer coil that is coupled to an RF generator; and the inner coil is disposed over the dielectric window and is at least partially oriented over the middle and inner zones of the Faraday shield that include consecutively repeating slots A and B, wherein the inner coil and outer coil, as correlated to the sets of radial slots, are connected to a tuning circuit, the turning circuit being configured adjust magnetic flux imparted through either or both of the outer zone and middle zone of the Faraday shield.

2. The plasma processing chamber as recited in claim 1, wherein each one of the slots A, B, and C are defined from a chevron shaped groove.

3. The plasma processing chamber as recited in claim 2, wherein the chevron shaped groove does not include a line of sight between respective sides of the Faraday shield.

4. The plasma processing chamber of claim 1, wherein the space is between 0.3 mm and 1.5 mm.

5. The plasma processing chamber of claim 1, wherein the inner zone has 25 of said first set of radial slots (A), the middle zone has 50 of said first set of radial slots (A) and said second set of radial slots (B), and the outer zone has 100 of said first set of radial slots (A), said second set of radial slots (B), and said third set of radial slots (C).

6. A plasma processing system, comprising:
a chamber including a lower liner and an upper liner with a tapered structure, the upper liner being grounded;
an electrostatic chuck for receiving a substrate;
a Faraday shield having an outer edge that is configured for support on a lowered upper surface of the upper liner, wherein O-rings are provided between the lowered upper surface of the upper liner and the outer edge of the Faraday shield;
a dielectric window disposed over the Faraday shield and supported on the outer edge of the Faraday shield, wherein other than the outer edge where the dielectric window is disposed over, a space separating the Faraday shield from the dielectric window is set to be between 0.3 mm and 1.5 mm, and the Faraday shield is inside the chamber facing the electrostatic chuck, the Faraday shield being electrically grounded by contact with the upper liner and further facilitated via the O-rings, the Faraday shield includes, (a) an inner zone having an inner radius range that surrounds a center hole that bounds an inner edge;
(b) a middle zone having a middle radius range;
(c) an outer zone having an outer radius range, the inner zone being adjacent to the middle zone, and the middle zone being adjacent to the outer zone;
(d) a first set of radial slots (A) extending through the inner zone, the middle zone, and the outer zone;
(e) a second set of radial slots (C) extending through only the outer zone; and
(f) a third set of radial slots (B) extending through the middle zone and outer zone, wherein the first, second and third sets of radial slots are consecutively arranged radially around the Faraday shield in a repeating pattern of slots A, C, B, C the outer edge of the Faraday shield surrounds the outer zone, such that the repeating pattern of slots A, C, B, C do not extend into the outer edge and the first set of radial slots A do not extend into the inner edge;

transformer coupled plasma (TCP) coils disposed over the dielectric window, the TCP coils includes an inner coil and an outer coil, each of the inner coil and outer coil has a flat coil distribution with a circular winding, wherein, the outer coil is oriented over the outer zone of the Faraday shield that includes consecutively repeating slots A, C, B, C to define an open area under the outer coil in the outer zone to provide passage for magnetic flux generated by the outer coil that is coupled to an RF generator; and the inner coil is oriented over the middle and inner zones of the Faraday shield that include consecutively repeating slots A, B;

wherein the inner zone has 25 of said first set of radial slots (A), the middle zone has 50 of said first set of radial slots (A) and said second set of radial slots (B), and the outer zone has 100 of said first set of radial slots (A), said second set of radial slots (B), and said third set of radial slots (C);

wherein the inner coil and outer coil are connected to a tuning circuit, the turning circuit being configured adjust magnetic flux imparted through either or both of the outer zone and middle zone of the Faraday shield.

7. The plasma processing system of claim 6, wherein each one of the slots A, B, and C are defined from a chevron shaped groove.

8. The plasma processing system of claim 7, wherein the chevron shaped groove does not include a line of sight between respective sides of the Faraday shield.

9. The plasma processing system of claim 6, wherein the Faraday shield is made of stainless steel, or is made of stainless steel having a passivation coating of nitric acid, or is made of Hastalloy, or is made of Titanium.

* * * * *